United States Patent [19]

Mallinson

[11] Patent Number: 4,926,178
[45] Date of Patent: May 15, 1990

[54] DELTA MODULATOR WITH INTEGRATOR HAVING POSITIVE FEEDBACK

[75] Inventor: A. Martin Mallinson, Billerica, Mass.

[73] Assignee: Analog Devices, Inc., Norwood, Mass.

[21] Appl. No.: 218,645

[22] Filed: Jul. 13, 1988

[51] Int. Cl.$^5$ .............................................. H03M 3/02
[52] U.S. Cl. ...................................... 341/143; 375/28
[58] Field of Search ................... 341/143, 155; 375/28

[56] References Cited

U.S. PATENT DOCUMENTS

| 3,899,754 | 8/1975 | Brolin | 341/143 |
| 3,956,700 | 5/1976 | Condon | 341/143 X |
| 4,612,654 | 9/1986 | DeFreitas | 341/143 X |

FOREIGN PATENT DOCUMENTS 56-103766  8/1981  Japan.
59-132227  7/1984  Japan.

OTHER PUBLICATIONS

J. E. Flood et al., Proc. IEEE, vol. 118, No. 9, Sep. 1971, pp. 1155–1161, see p. 1156, ch. 2, Fig. 1a.

F. Aghion et al., Alta Frequenza, vol. XLVII, No. 11, Nov. 1978, pp. 485E–815–488E–818.
Ed. by D. Shiengold, Analog-Digital Conversion Handbook, 1986, pp. 481–489.
"Digital Meets Analog", pp. 418–425, date unknown.

Primary Examiner—Vit W. Miska
Assistant Examiner—Marc S. Hoff
Attorney, Agent, or Firm—Wolf, Greenfield & Sacks

[57] ABSTRACT

A delta modulator includes an integrator, a comparator for sensing the output of the integrator and a flip flop for synchronizing the comparator output to a clock signal and providing an error signal to the input of the integrator. The output of the delta modulator is a data stream having a time-averaged duty cycle that represents the input signal amplitude. The integrator includes an amplifier that is provided with positive feedback. Error caused by the finite open loop gain of the amplifier is cancelled by the positive feedback. As a result, high accuracy is achieved. The integrator amplifier is stabilized by the overall negative feedback of the delta modulator loop.

13 Claims, 6 Drawing Sheets

DELTA MODULATOR WITH INTEGRATOR HAVING POSITIVE FEEDBACK

FIELD OF THE INVENTION

This invention relates to delta modulators and to other charge balance loops that convert an analog voltage to a data stream representative of the analog voltage and, more particularly, to delta modulators that utilize an integrator with positive feedback for high accuracy.

BACKGROUND OF THE INVENTION

Delta modulators, also called sigma delta or delta sigma converters, are closed loop systems with quantized feedback that is synchronized to a clock signal. The delta modulator is one form of a charge balance loop. The basic elements of a delta modulator include an amplifier connected as an integrator, a comparator connected to the output of the integrator and a quantizing element connected in a feedback loop between the output of the comparator and an input to the integrator. The quantizing element is typically a D-type flip flop. An analog input signal and a digital error signal derived from the flip flop output are provided to the input of the integrator. The comparator determines whether the integrator output is above or below a prescribed reference level. The flip flop output is a data stream synchronized to the clock signal and includes information representative of the amplitude of the analog input signal.

The data stream from a delta modulator loop is typically supplied to a digital filter which extracts from the data stream information regarding the input signal amplitude. In a conventional delta modulator, the duty cycle of the data stream averaged over a prescribed time period is a measure of the input amplitude. The configuration wherein a delta modulator is followed by a digital filter can be utilized as an analog-to-digital converter. One factor limiting widespread use of such analog-to-digital converters in the past has been the complexity of the digital filter circuits required to process the data stream. Large scale integrated circuits have made the implementation of this type of analog-to-digital converter more feasible.

Several factors limit the accuracy of the delta modulator. One limiting factor is the open loop gain of the integrator. The error is inversely proportional to the open loop gain. For example, if the open loop gain is 1,000, the accuracy is no better than one part in 1,000. Therefore, efforts have been made in the prior art to provide integrators with very high open loop gains. Nonetheless, it is very difficult to obtain accuracies in excess of 16 bits. For 20-bit accuracy, an open loop gain on the order of $10^8$ is required. Integrators having such high open loop gains are extremely unstable and are very susceptible to oscillation.

It is a general object of the present invention to provide improved charge balance loops.

It is another object of the present invention to provide improved delta modulators having high accuracy.

It is a further object of the present invention to provide delta modulators wherein accuracy is not limited by the open loop gain of the integrator.

It is a further object of the present invention to provide delta modulators wherein positive feedback is utilized in the integrator to improve accuracy.

SUMMARY OF THE INVENTION

According to the present invention, these and other objects and advantages are achieved in a delta modulator for providing a digital output signal representative of an input signal amplitude. The delta modulator comprises integrator means responsive to the input signal for providing an integrator output signal, comparator means responsive to the integrator output signal for providing a comparator output signal having a first state when the integrator output signal is greater than a prescribed reference level and a second state when the integrator output signal is less than the prescribed reference level, and synchronizing means for providing to an input of the integrator means an error signal representative of the output state of the comparator means and synchronized to a clock signal. The error signal has a first level which causes the integrator means to integrate in a positive direction and a second level which causes the integrator means to integrate in a negative direction. The digital output signal corresponds to the levels of the error signal.

According to the invention, the integrator means includes positive feedback means for supplying a positive feedback signal for cancelling the error due to the finite open loop gain of the integrator means. Although the integrator means itself is unstable because of the positive feedback signal, the overall delta modulator loop is stable. The use of positive feedback in the integrator means eliminates the effect of integrator open loop gain on the accuracy of the delta modulator. The integrator means typically comprises amplifier means having an output and an input, and an integrator capacitor coupled between the output and the input. The positive feedback means is typically coupled between the output of the amplifier means and the input or an intermediate node of the amplifier means.

According to another aspect of the present invention, a charge balance loop for providing a digital output signal representative of an input signal amplitude comprises integrator means responsive to the input signal for providing an integrator output signal, the integrator means including positive feedback means, and quantized feedback means for quantizing the integrator output signal and for providing to an input of the integrator means an error signal that balances the charge on the integrator means. The error signal is synchronized to a clock signal.

In one preferred embodiment, the integrator means having positive feedback is utilized in a single bit delta modulator including a comparator for sensing the output of the integrator means and a flip flop responsive to the comparator output and to a clock signal for providing an error signal to the input of the integrator means.

In another preferred embodiment, the integrator means having positive feedback is utilized in a multiple-bit delta modulator including an analog-to-digital converter for sensing the output of the integrator means and for providing a multiple-bit parallel output, and a digital-to-analog converter for converting the multiple-bit output to an error signal having multiple discrete levels. The multiple-bit output and the error signal are synchronized to a clock signal.

According to still another embodiment of the invention, the integrator means having positive feedback is utilized in a delta modulator having parallel, single-bit feedback loops, each comprising a comparator for sensing the output of the integrator means and a flip flop responsive to the comparator output and to a clock signal for providing an error signal to the input of the integrator means. Phase-shifted clock signals are supplied to the different feedback loops. As a result, phase-shifted output data streams are provided simultaneously

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1:
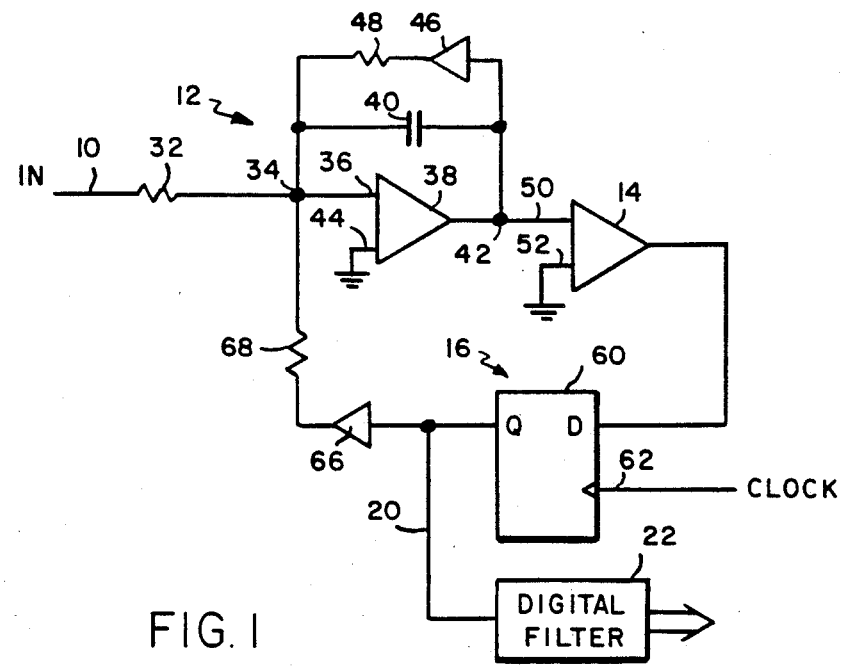
FIG. 1 is a block diagram of a delta modulator in accordance with the present invention.

A delta modulator in accordance with the present invention is shown in FIG. 1. An analog input signal is coupled to an input terminal 10. The delta modulator is a closed loop that includes an integrator 12, a comparator 14 and a synchronizing element 16, which in the present example is a D-type flip flop. An output from the delta modulator loop on a line 20 is supplied to the input of a digital filter 22. The output of the digital filter 22 is a parallel binary representation of the input signal amplitude.

The input signal from input terminal 10 is coupled through a resistor 32 to a node 34. A signal input 36 to an amplifier 38 is also coupled to node 34. An integrating capacitor 40 is connected between an output 42 of amplifier 38 and input 36. A reference input 44 of amplifier 38 is coupled to a reference voltage such as ground. Amplifier output 42 is coupled to the input of a feedback amplifier 46. The output of amplifier 46 is coupled through a resistor 48 to amplifier input 36. Amplifier 46 and resistor 48 provide positive feedback as described hereinafter. Amplifier 38, capacitor 40, feedback amplifier 46 and resistor 48 are the components of integrator 12 with positive feedback.

Output 42 of amplifier 38 is connected to a first input 50 of the comparator 14. A second input 52 of comparator 14 is connected to a reference voltage, such as ground. The output of comparator 14 is connected to the D input of a D-type flip flop 60. A clock signal is connected to a clock input 62 of flip flop 60. The Q output of flip flop 60 is connected to output line 20 and is also connected to the input of a buffer 66. The output of buffer 66 is connected through a resistor 68 to node 34. The buffer 66 converts the digital logic output of flip flop 60 to voltage levels suitable for input to integrator 12. Typically, buffer 66 provides equal positive and negative voltages corresponding to logic one and logic zero outputs, respectively, from flip flop 60.

Figure 2:
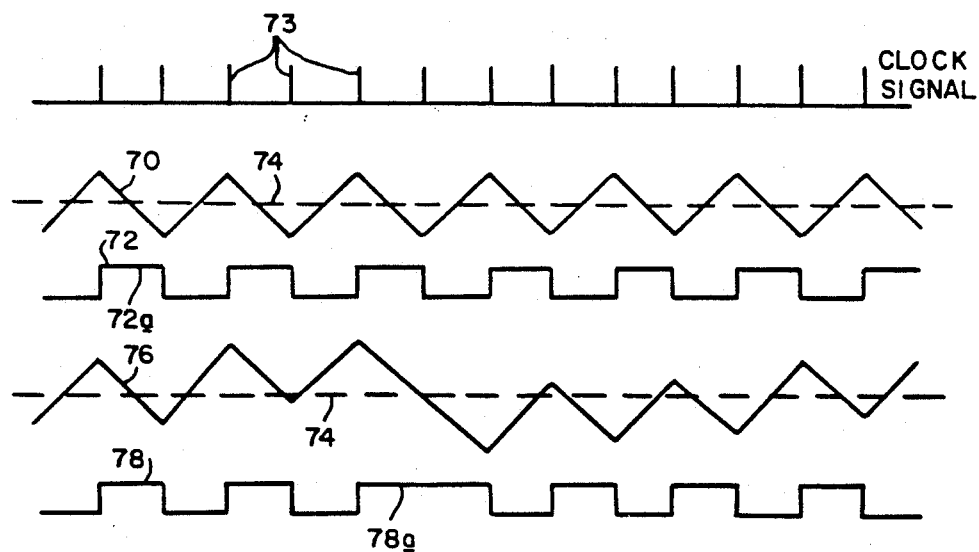
FIG. 2 is a timing diagram that illustrates waveforms in the delta modulator of FIG. 1.

Operation of the delta modulator is illustrated in FIG. 2. Waveforms 70 and 72 illustrate the case where the input signal at terminal 10 is zero. Waveform 70 is the output of integrator 38, and waveform 72 is the Q output of flip flop 60. The Q output of flip flop 60 is supplied through buffer 66 and resistor 68 as an error signal to the input of integrator 12. Waveform 72 alternates between a first level 72a and a second level 72b. The transitions between levels 72a and 72b occur in synchronism with clock pulses 73. The level 72a causes integrator 38 to integrate in a negative direction, while level 72b causes integrator 38 to integrate in a positive direction. When the input signal is zero, the integrator output waveform 70 is symmetrical about a reference voltage 74 at input 52 of comparator 14. Each time the waveform 70 crosses reference voltage 74 (in this case, ground), the comparator 14 output changes state. The Q output of flip flop 60 changes state in synchronism with clock input 62. The output of the integrator 12 is balanced on a time-averaged basis by the alternating states of the error signal.

Waveforms 76 and 78 of FIG. 2 illustrate operation of the delta modulator for the case where the input signal is slightly negative. The delta modulator is unbalanced by the input signal, and the integrator 12 ramps in the positive direction more rapidly than in the negative direction. Integrator output waveform 76 gradually becomes more positive until it no longer crosses the reference voltage 74. Then, the error signal does not change state, and the integrator 12 continues to ramp in a negative direction since the error signal remains at positive level 78a. The resulting data stream at the Q output of flip flop 60 contains information representative of the input signal amplitude. Similar operation, but with reversed polarities, is obtained for a positive input signal. As the input signal becomes more positive or more negative, the data stream, on average, remains high or low for a correspondingly longer time.

In general, the output of the delta modulator is a data stream on line 20 wherein the long-term duty cycle varies as a function of the input signal. As shown in FIG. 2, the data stream has a 50% duty cycle for a zero input signal. As the input signal goes negative, the signal on line 20 is at the high level more than at the low level. Conversely, for a positive input signal, the data stream is at the low level more than at the high level. The digital filter determines the duty cycle over a fixed period such as 1,000 clock pulses in order to estimate the input signal amplitude Suitable digital filters are known to those skilled in the art.

As noted above, feedback amplifier 46 and resistor 48 provide positive feedback in a configuration which reduces errors in the delta modulator output. The signal path through amplifier 38 between input 36 and output 42 is generally inverting. That is, an input signal current into input 36 having a polarity which establishes a small positive signal on input 36 relative to input 44, will cause the output 42 to decrease in voltage.

Figures 3, 4:
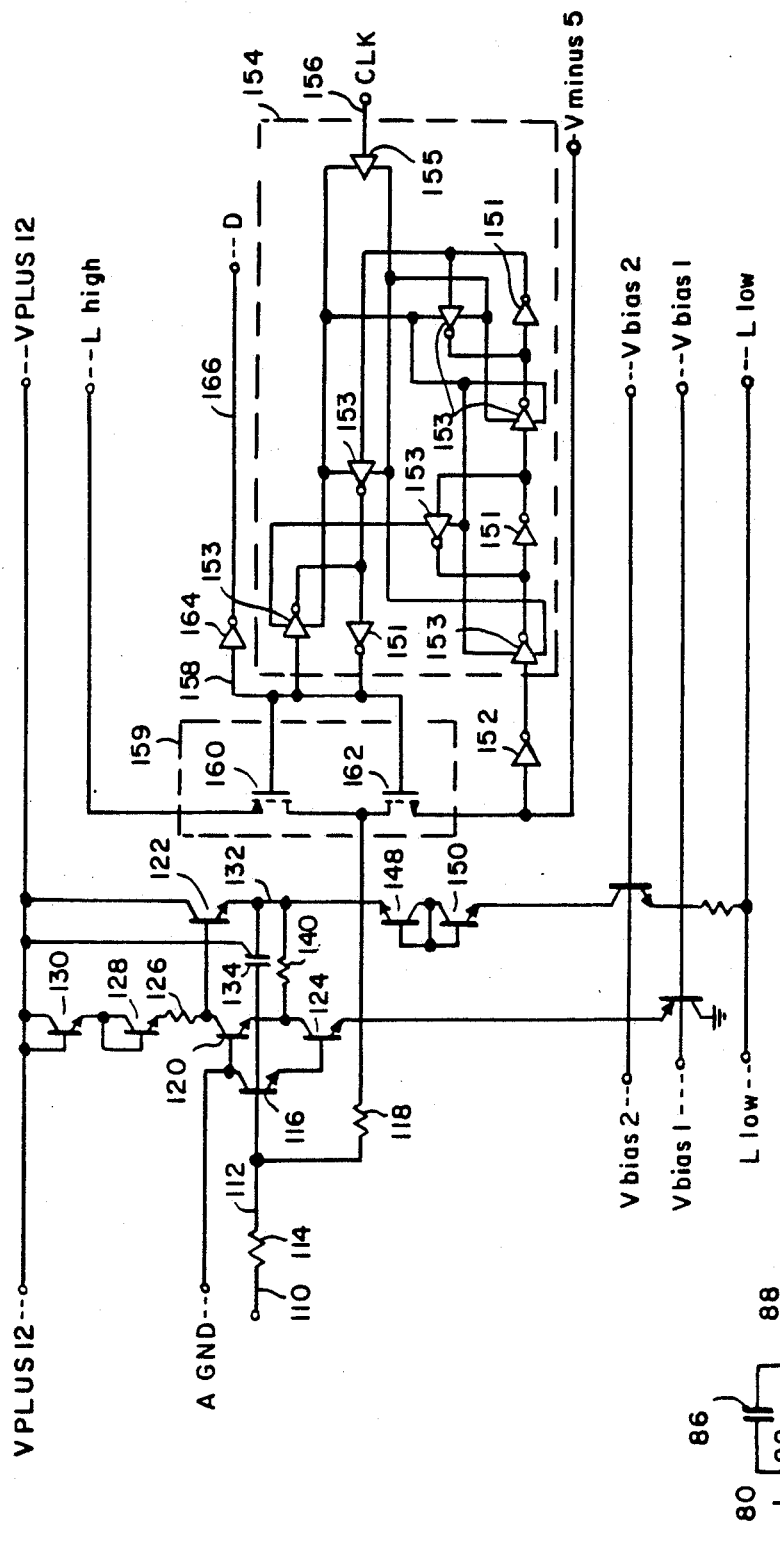
FIG. 3 is a schematic diagram of a prior art integrator not provided with positive feedback.
FIG. 4 is a schematic diagram of a delta modulator in accordance with the present invention.

A prior art integrator not provided with positive feedback is shown in FIG. 3. An input signal is coupled through a resistor 80 to the inverting input 82 of an amplifier 84. An integrator capacitor 86 is coupled between amplifier output 88 and the inverting input 82. A noninverting input 90 is connected to ground. In the prior art, the effect of finite loop gain in amplifier 84 can be measured at input 82. A small signal is maintained between input 82 and input 90 for all values of output voltage on output 88. The error signal is such that for all positive output voltages on output 88, input 82 is negative relative to input 90. The magnitude of the voltage by which input 82 is negative relative to input 90 is inversely proportional to the open loop gain of amplifier 84. Any such small signal between input 82 and input 90 represents an error in the delta modulator loop. In the prior art, the reduction of this error was achieved by increasing the open loop gain of amplifier 84.

In the present invention, the integrator is provided with positive feedback. Referring again to FIG. 1, the effect of the positive feedback is to change the sign of the small error signal that is maintained between input 36 and input 44. Despite the overall negative feedback in the delta modulator (current that is forced into input 36 causes the output 42 to decrease in voltage), it is possible for the error voltage on input 36 to be positive relative to input 44. The positive feedback is accomplished in the circuit of FIG. 1 by amplifier 46 and resistor 48. Amplifier 46 has an inverting characteristic and injects a current through resistor 48 into node 34 that offsets the error voltage between inputs 36 and 44. Resistor 48 is selected to inject sufficient current to offset the normal error voltage and produce a small error voltage of opposite polarity to the normal error voltage. The resistor 48 can be adjustable, if desired. It will be understood that the error voltage between inputs 36 and 44 is a function of the open loop gain of amplifier 48 and of the positive feedback; this error voltage is not to be confused with the loop-stabilizing error signal that is provided through resistor 68.

By way of example, assume that a positive input signal is applied to input terminal 10, causing integrator output 42 to ramp in a negative direction. The normal error voltage, which brings input 36 slightly positive relative to input 44, is offset by the positive feedback supplied by amplifier 46 and resistor 48. The amplifier 46 injects current into node 34 which forces input 36 slightly negative relative to input 44. As a result, the error caused by the finite gain of amplifier 38 is eliminated Under normal circumstances, positive feedback produces an unstable configuration and is to be avoided. However, in the present invention, an integrator with positive feedback is utilized within the negative feedback loop of the delta modulator, and the overall circuit is stable. Positive feedback is utilized in the integrator 12 in a controlled manner to establish a transfer function which is independent of the open loop gain of the integrator. Positive feedback can be provided in a variety of different configurations.

A preferred embodiment of a delta modulator circuit including an integrator having positive feedback is shown in FIG. 4. Input terminal 110 corresponds to input terminal 10 in FIG. 1, and node 112 corresponds to node 34 in FIG. 1. The input signal from terminal 110 is supplied through a resistor 114 to node 112. Also coupled to node 112 are the base of a transistor 116 and a resistor 118 which receives an error signal. The collector of transistor 116 is coupled to the base of a transistor 120, and the collector of transistor 120 is coupled to the base of a transistor 122. The emitter of transistor 116 is connected in a darlington configuration to the base of a transistor 124. The collector of transistor 124 is coupled to the emitter of transistor 120, and the collector of transistor 120 is coupled through resistor 126 and diodes 128, 130 to a positive supply voltage. The emitter of transistor 122, which functions as an emitter follower, is an output 132 of the integrator. A feedback capacitor 134 is coupled between output 132 and node 112 A resistor 140 coupled between output 132 and the collector of transistor 124 supplies positive feedback in the integrator.

The positive feedback resistor 140 compensates for current changes through collector resistor 126. An increase in current through collector resistor 126 produces a decrease in current through feedback resistor 140 so that the collector current through transistor 124 is approximately constant. As a result, the error voltage at node 112 is compensated by the positive feedback, as described above in connection with FIG. 1. In order to provide the required positive feedback, resistor 140 is slightly smaller than resistor 126. In a preferred embodiment, resistor 126 is about 50K ohms and resistor 140 is about 48K ohms.

It will be understood that the integrator illustrated in FIG. 4 is unstable when operated alone, but assumes a stable configuration when operated in the delta modulator loop. For a preferred clock frequency of 1 MHz, the capacitor 134 has a value of 10 picofarads.

The output 132 of the integrator shown in FIG. 4 is level shifted by a zener diode comprising transistors 148 and 150 and is coupled to the input of a comparator 152. In the embodiment of FIG. 4, the comparator 152 is an inverter. The output of comparator 152 is coupled to the D input of a flip flop 154. The flip flop 154 includes inverters 151, controlled inverters 153 and a clock driver 155. Since the construction of D-type flip flops is well known to those skilled in the art, the construction of flip flop 154 is not described in detail. The flip flop 154 receives a clock input on a line 156 and provides a data stream on a line 158. The data stream is coupled to a buffer 159 comprising MOS transistors 160 and 162 in a CMOS configuration. The output of the buffer 159 is coupled through resistor 118 to node 112. As described above, the feedback loop comprising comparator 152, flip flop 154 and buffer 159 provides an error signal to the input of the integrator for balancing the charge on the integrator capacitor 134. The data stream on line 158 is coupled through an inverter 164 as a loop output on a line 166.

The delta modulator described hereinabove is one example of a more general type of circuit known as a charge balance loop. The charge balance loop includes an integrator and feedback means for sensing the output of the integrator and for supplying a quantized error signal to the integrator input. Depending on the configuration of the charge balance loop, the error signal may be synchronized to one or more clock signals and may have two or more discrete levels. In each case, the error signal has a parameter representative of the input signal amplitude. An integrator having positive feedback can be utilized in any such charge balance loop to eliminate errors resulting from the finite open loop gain of the amplifier.

Figure 5:
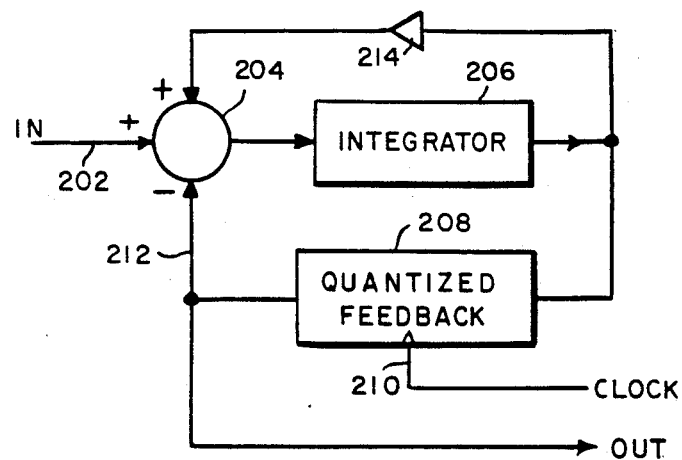
FIG. 5 is a block diagram of a charge balance loop including an integrator having positive feedback.

A generalized block diagram of a charge balance loop having an integrator utilizing positive feedback is shown in FIG. 5. An input signal is supplied on an input line 202 to a first input of an adder 204. The output of the adder 204 is coupled to the input of an integrator 206. The output of integrator 206 is coupled to an input of a quantized feedback unit 208 which receives a clock signal on a line 210. The quantized feedback unit 208 supplies an error signal on a line 212 to a second input of the adder 204. The output of integrator 206 is also coupled through a positive feedback element 214 to a third input of adder 204. The quantized feedback unit 208 is configured to provide negative feedback to adder 204, while feedback element 214 is configured to provide positive feedback to adder 204. The feedback element 214 provides sufficient positive feedback to eliminate errors due to the finite open loop gain of integrator 206. By comparison of FIGS. 1 and 5, it can be seen that integrator 206 corresponds to integrator 12; quantized feedback unit 208 corresponds to comparator 14, flip flop 60, buffer 66 and resistor 68; and feedback element 214 corresponds to feedback amplifier 46 and resistor 48. The function of adder 204 is performed by summing currents at node 34. Although the positive feedback element 214 is shown as separate from integrator 206 for clarity, these two elements are usually constructed as a single circuit, as shown in FIG. 4. The delta modulator shown in FIG. 1 has a one-bit output. A delta modulator having a multiple bit output is illustrated in block diagram form in FIG. 6. An input signal is coupled to integrator 12 having the same configuration as integrator 12, shown in FIG. 1 and described hereinabove. Integrator output 42 is coupled to the input of a flash analog-to-digital converter (ADC) 240. In the present example, the ADC 240 is a four-bit converter. It will be understood that any desired number of bits can be utilized. The ADC 240 includes a register for storage of the output data word. The output is synchronized to a clock signal on a line 242. The four-bit output of ADC 240 is coupled on a bus 244 to the inputs of a digital-to-analog converter (DAC) 246 and to the inputs of a digital filter 248. The output of DAC 246 is coupled through a resistor 250 to node 34.

Figure 6:
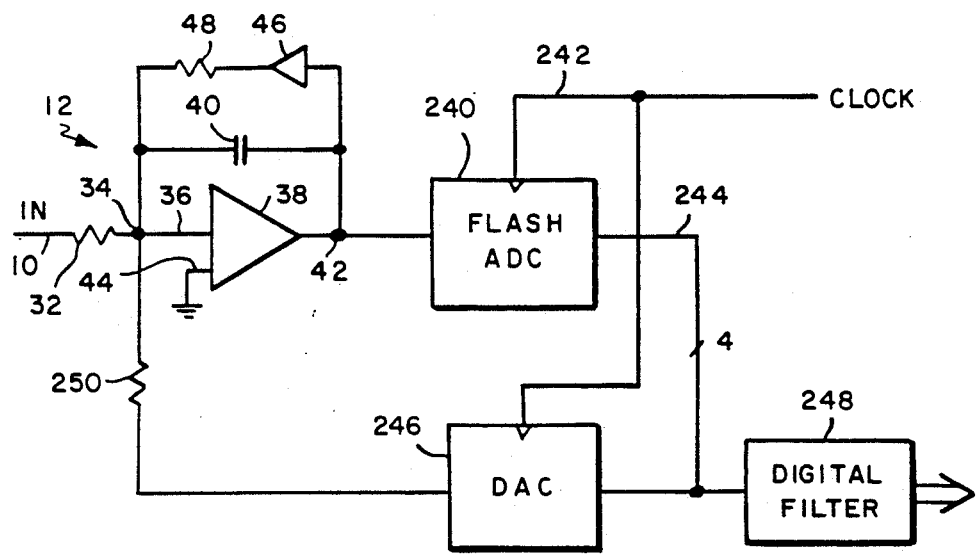
FIG. 6 is a block diagram of a 4-bit delta modulator.

The delta modulator shown in FIG. 6 differs from a single-bit delta modulator by sensing a number of different levels at the integrator output 42 and providing a data word on bus 244 representing the integrator output. The digital filter 248 receives a four-bit input, but otherwise performs a function similar to the digital filter 22 shown in FIG. 1. The error signal supplied by DAC 246 through resistor 250 has sixteen discrete levels rather than two. Four bits of information regarding the input signal are provided to the digital filter 286 for each clock pulse. Amplifier 46 and resistor 48 supply positive feedback in integrator 12, thereby reducing or eliminating errors due to the finite gain of amplifier 38.

Figure 7:
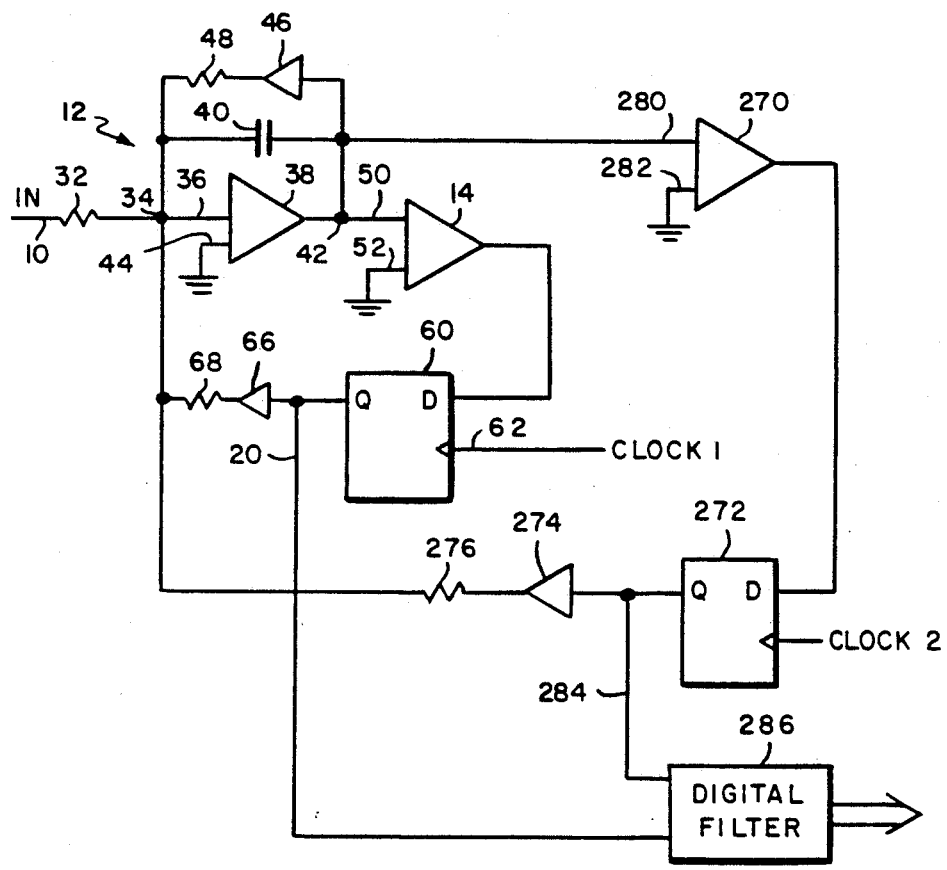
FIG. 7 is a block diagram of a delta modulator having two quantized feedback loops.

A delta modulator having two parallel feedback loops operating with phase-shifted clock pulses is shown in FIG. 7. The delta modulator of FIG. 7 includes all the elements of the delta modulator shown in FIG. 1. In addition, a second feedback loop comprising a comparator 270, a flip flop 272, a buffer 274 and a resistor 276 is coupled in parallel with the feedback loop comprising comparator 14, flip flop 60, buffer 66 and resistor 68. Amplifier output 42 is connected to one input 280 of comparator 270, and a second input 282 of comparator 270 is coupled to ground. The output of comparator 270 is coupled to the D input of flip flop 272. A clock signal is coupled to the clock input of flip flop 272. The G output of flip flop 272 is coupled on a line 284 to the input of buffer 274 and to the input of a digital filter 286. The output of buffer 274 is coupled through resistor 276 to node 34.

In a delta modulator having parallel feedback loops, the first feedback loop comprising comparator 14, flip flop 60 and buffer 66 is synchronized to a first clock signal, and the second feedback loop comprising comparator 270, flip flop 272 and buffer 274 is synchronized to a second clock signal. The first and second clock signals are out of phase by a prescribed fraction of a cycle Thus, the data streams at the outputs of flip flops 60 and 272 are shifted in phase. In one preferred embodiment, the positive going edge and the negative going edge of the same clock signal are used for driving the parallel feedback loops out of phase. The digital filter 286 receives data representative of the input signal amplitude at twice the rate of the delta modulator configuration shown in FIG. 1. As in the previous examples, amplifier 46 and resistor 48 supply positive feedback in integrator 12, thereby reducing or eliminating errors due to the finite gain of the amplifier 38.

A delta modulator was constructed in accordance with FIG. 4. Without positive feedback in the integrator, the accuracy was about 0.5%. When the positive feedback is provided as shown and described above, the accuracy was about 60 parts per million, and the circuit operated in a stable mode.

While there has been shown and described what is at present considered the preferred embodiments of the present invention, it will be obvious to those skilled in the art that various changes and modifications may ge made therein without departing from the scope of the invention as defined by the appended claims.

What is claimed is:

1. A delta modulator for providing a digital output signal representative of an input signal amplitude, comprising:
   integrator means responsive to said input signal for providing an integrator output signal at an output thereof, said integrator means including positive feedback means;
   comparator means responsive to said integrator output signal for providing a comparator output signal having a first state when said integrator output signal is greater than a prescribed reference level and a second state when said integrator output signal is less than the prescribed reference level; and
   synchronizing means for providing to an input of said integrator means an error signal representative of the output state of said comparator means and synchronized to a clock signal, said error signal having a first level which causes said integrator means to integrate in a positive direction and a second level which causes said integrator means to integrate in a negative direction, said digital output signal corresponding to the levels of said error signal.

2. A delta modulator as defined in claim 1 wherein said integrator means comprises amplifier means having an output and an input, and an integrator capacitor coupled between said output and said input.

3. A delta modulator as defined in claim 1 wherein said synchronizing means comprises a D-type flip flop having a D input coupled to said comparator output signal and a clock input coupled to said clock signal.

4. A delta modulator as defined in claim 2 wherein said positive feedback means comprises means responsive to the integrator output signal for supplying a positive feedback signal for cancelling an amplifier error due to said amplifier means having finite open loop gain.

5. A delta modulator as defined in claim 4 wherein said positive feedback signal is supplied to the input of said amplifier means.

6. A charge balance loop for providing a digital output signal representative of an input signal amplitude comprising:
   integrator means responsive to said input signal for providing an integrator output signal at an output thereof, said integrator means including positive feedback means;

comparator means responsive to said integrator output signal for providing a comparator output signal having a first state when said integrator output signal is greater than a prescribed reference level and a second state when said integrator output signal is less than the prescribed reference level; and feedback means for providing to an input of said integrator means a binary error signal representative of the output state of said comparator means, said error signal having a first level which causes said integrator means to integrate in a positive direction and a second level which causes said integrator means to integrate in a negative direction, said digital output signal corresponding to the levels of said error signal.

7. A charge balance loop as defined in claim 6 wherein said integrator means comprises amplifier means having an output and an input, and an integrator capacitor coupled between said output and said input.

8. A charge balance loop as defined in claim 7 wherein said positive feedback means comprises means responsive to the integrator output signal for supplying a positive feedback signal for cancelling an amplifier error due to said amplifier means having finite open loop gain.

9. A charge balance loop as defined in claim 8 wherein said positive feedback signal is supplied to the input of said amplifier means.

10. A charge balance loop for providing a digital output signal representative of an input signal amplitude comprising:

integrator means responsive to said input signal for providing an integrator output signal at an output thereof, said integrator means including positive feedback means; and quantized feedback means for quantizing said integrator output signal into at least two discrete levels, and for providing to an input of said integrator means an error signal that balances a charge on said integrator means, said error signal being responsive to said at least two discrete levels and being synchronized to a clock signal.

11. A charge balance loop as defined in claim 10 wherein said integrator means comprises amplifier means having an output and an input, and an integrator capacitor coupled between said output and said input.

12. A charge balance loop as defined in claim 11 wherein said positive feedback means comprises means responsive to the integrator output signal for supplying a positive feedback signal for cancelling an amplifier error due to said amplifier means having finite open loop gain.

13. A charge balance loop as defined in claim 12 wherein said positive feedback signal is supplied to the input of said amplifier means.

* * * * *